(12) United States Patent
Dove et al.

(10) Patent No.: US 6,388,206 B2
(45) Date of Patent: *May 14, 2002

(54) MICROCIRCUIT SHIELDED, CONTROLLED IMPEDANCE "GATLING GUN" VIA

(75) Inventors: Lewis R Dove, Monument; John F. Casey, Colorado Springs, both of CO (US); Ron Barnett, Santa Rosa, CA (US)

(73) Assignee: Agilent Technologies, Inc., Palo Alto, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/182,287

(22) Filed: Oct. 29, 1998

(51) Int. Cl.[7] .............................. H01R 12/04; H05K 1/11
(52) U.S. Cl. ......................... 174/262; 174/261
(58) Field of Search ................. 174/262, 263, 174/264, 265, 266, 255, 261

(56) References Cited

U.S. PATENT DOCUMENTS

| | | | |
|---|---|---|---|
| 3,895,435 A | * 7/1975 | Turner et al. .................. | 29/625 |
| 4,494,083 A | 1/1985 | Josefsson et al. .............. | 333/33 |
| 5,200,580 A | * 4/1993 | Sienski ........................ | 174/264 |
| 5,522,132 A | * 6/1996 | Mattei ......................... | 29/846 |
| 5,828,555 A | * 10/1998 | Itoh ............................ | 361/784 |
| 5,830,301 A | * 11/1998 | Sturzebecher et al. ... | 156/89.16 |
| 5,842,877 A | 12/1998 | Martensson et al. .......... | 439/91 |
| 5,920,242 A | * 7/1999 | Oya et al. ..................... | 333/189 |
| 6,023,211 A | * 2/2000 | Somei ......................... | 333/246 |
| 6,031,188 A | * 2/2000 | Pluymers et al. ........... | 174/255 |

FOREIGN PATENT DOCUMENTS

EP 0318311 11/1988 ............ H01R/1/04

* cited by examiner

Primary Examiner—Albert W. Paladini
Assistant Examiner—Jeremy Norris
(74) Attorney, Agent, or Firm—Patrick J. Murphy

(57) ABSTRACT

A "Gatling gun" via to interconnect circuitry from a first side of a substrate or printed circuit board, to a second side of the substrate or board. The present via structure comprises a center conductor via surrounded by a plurality of ground vias. The plurality of ground vias shield the center conductor via, thus providing electrical isolation for the conductor via from the rest of the circuitry. In one embodiment, the conductor via is electrically connected to a conductive pattern on the substrate by a wire bond.

4 Claims, 2 Drawing Sheets

MICROCIRCUIT SHIELDED, CONTROLLED IMPEDANCE "GATLING GUN" VIA

FIELD OF THE INVENTION

The present invention relates generally to microcircuits and more particularly to a "Gatling gun" via, that is a via having a center conductor via surrounded by ground vias.

BACKGROUND OF THE INVENTION

Today's complex integrated circuits typically employ several million transistors on a single integrated circuit substrate. Multiple layers of conductive material are formed overlying the substrate in order for these millions of transistors to interconnect and work as a whole. To facilitate electrical communication between conductive layers, via structures are used. Vias are openings etched through dielectric layers between a first conductive layer and a second conductive layer.

Circuit board interconnects generally fall into three categories. The first category employs a laminated epoxy-filled cloth. The individual layers have electronically conductive paths of patterned copper. The second category uses a base structure of epoxy filled-cloth. This base is then covered with multiple layers of photoimageable dielectric and patterned copper. The third category is composed of multiple layers of laminated ceramic, with individually patterned copper. The present invention is directed to the formation of "Gatling gun" vias with reference to the second category, although the concepts herein can apply to the other two interconnect schemes.

Vias can be formed by drilling holes and then plating the paths through the holes. The via holes can extend through the complete multilayer board. In this configuration, the vias are electrically coupled to each copper (i.e., conductive) layer. Alternatively, vias can be formed using a conventional photoimage-generated via structure.

One problem with via structures employed in high frequency applications is the lack of AC electrical isolation between the via and the remainder of the microcircuit. Another problem is that standard vias (formed either by drilling or by photoimaging) do not provide a controlled impedance environment at high frequencies.

SUMMARY OF THE INVENTION

The present invention provides a "Gatling gun" via to interconnect circuitry from a first side of a substrate or printed circuit board, to a second side of the substrate or board. The present via comprises a center conductor via surrounded by a plurality of ground vias. The plurality of ground vias shield the center conductor via, thus providing electrical isolation for the conductor via from the rest of the circuitry. One feature of the present invention is that the plurality of ground vias can be modified, adjusting their diameters and their placement relative to the center conductor via, in order to affect the overall characteristic impedance of the Gatling gun via. This feature is useful when propagating high frequency signals from the first side to the second side of the substrate.

DETAILED DESCRIPTION OF THE PREFERRED EMBODIMENT

Richard J. Gatling was born in 1818 in North Carolina, U.S.A. In his early 20s, Gatling invented and improved upon many agricultural implements, including a machine for sowing cotton and a steam-driven plow. But Gatling is probably best remembered for inventing a rapid-firing gun that bears his name.

Following the outbreak of the American Civil War, Gatling became interested in firearms. In 1862 he patented the hand-crank, rapid fire Gatling gun. The first Gatling gun has six rifle barrels mounted around a central shaft. The barrels rotated around the shaft while the gun was operating. Each barrel was mechanically loaded once at the top of a rotation and fired once at the bottom of a rotation. The empty shell was ejected as the barrel advanced up towards a reload. Early models of the Gatling gun had fired approximately 300 rounds per minute. By 1882, Gatling improved upon his design so that the gun fired 1200 rounds per minute.

The design of the Gatling gun inspires the present invention. The model of a plurality of barrels around a central shaft is adopted in an improved via structure that provides better isolation and improved controlled impedance for electrically interconnecting circuitry from a first side of a substrate or printed circuit board, to circuitry on a second side of the substrate or board. The discussion below will disclose the present invention in a printed circuit board environment. But one skilled in the art will appreciate the present invention's applicability in a wide variety of applications, including single layer and multi-layer substrates and ceramic.

Figure 1:
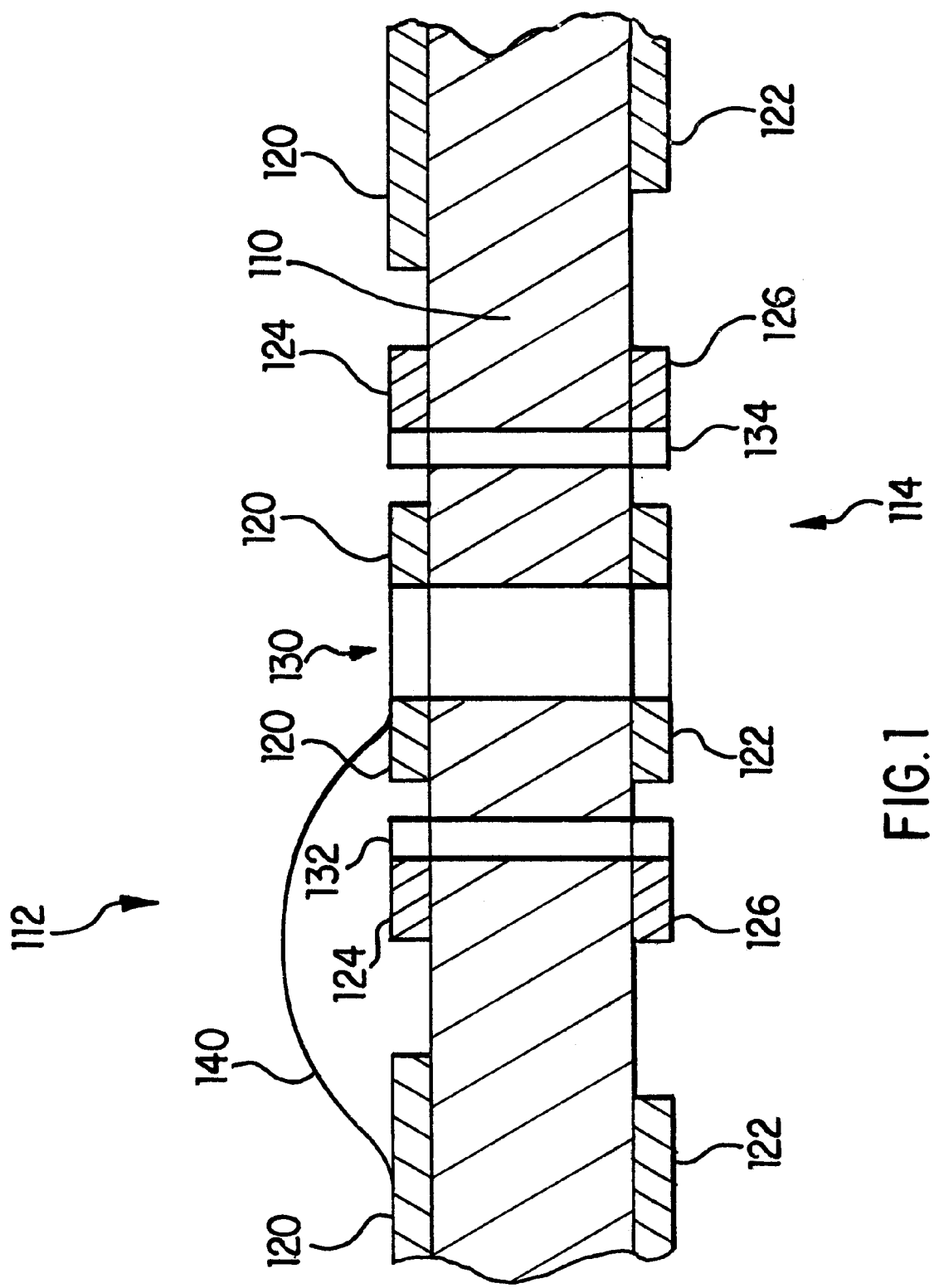
FIG. 1 shows a schematic cross-sectional view of a laminated epoxy core structure with a Gatling gun via according to the present invention.

FIG. 1 shows a schematic cross-sectional view of a laminated epoxy core structure with a Gatling gun via. A base or core laminate of multiple epoxy-filled cloth layers 110 has formed on its topside 112 a pattern of electrically conductive copper 120 while on its backside 114, another pattern of electrically conductive copper 122 is formed. Patterns of copper (items 124 and 126) are also formed on the laminate 110 which are electrically tied to ground as will be discussed more fully below. The patterns (items 120, 122, 124 and 126) are generally disposed in x- and y-direction planes.

The cross section also shows three drilled holes at 130, 132 and 134 extending through the base laminate 110 as well as the copper patterns 120, 122, 124 and 126. Holes 130, 132 and 134 are generally disposed in a z-direction, interplanar to the patterns 120, 122, 124 and 126.

Once the holes are drilled, a dry film (not shown) can be vacuum laminated to the backside 114 in a conventional manner. The hole at 130 is then filled with conductive, plateable and solderable polymer (not shown) which can be applied as a paste or liquid in a conventional manner. The polymer is then cured and the dry film is stripped. This then forms the center conductor via at 130. In a similar manner, the holes at 132 and 134 are filled and cured.

A wire bond 140 electrically connects the center conductor via 130 to the electrically conductive pattern 120. In another preferred embodiment, the wire bond 140 could be a ribbon bond or dielectric tape or any material that will be able to propagate an electrical signal from the center conductor 130, over the ground via 132 to the electrically conductive pattern 120.

Figure 2:
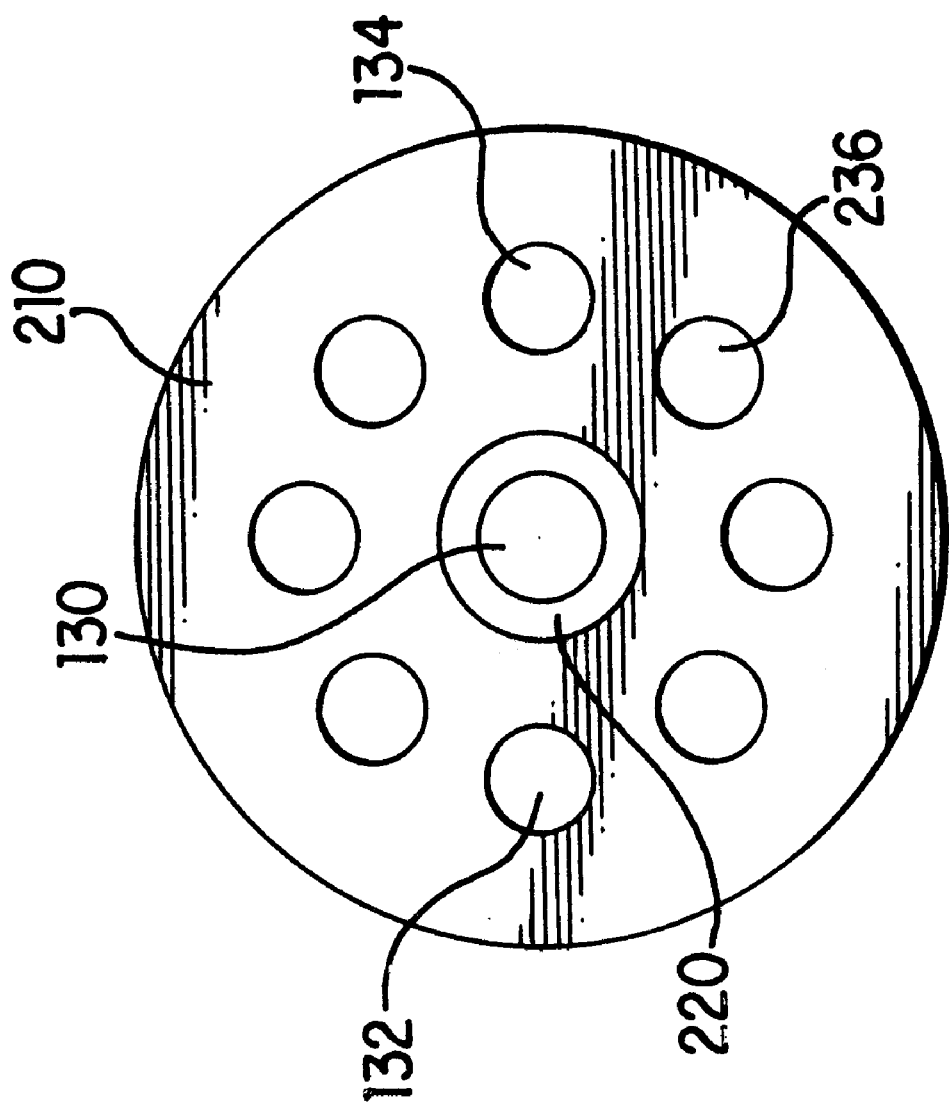
FIG. 2 shows a top view of the Gatling gun via.

FIG. 2 shows a top view of the Gatling gun via according to the present invention. The center conductor via 130 is surrounded by a plurality of ground vias 132, 134 and 232. A space 220 isolates the conductor via 130 from a ground plane 210 which electrically grounds the plurality of ground vias 132, 134 and 236.

FIG. 2 illustrates the center conductor 130 being surrounded by eight ground vias. This number is not terribly important. Isolation could be accomplished with as little as two vias. Increasing the number of ground vias, increases electrical isolation. Controlling the impedance of the structure is accomplished by varying the diameters of the conductor and ground vias, as well as their relative position from each other. One benefit of the present invention is that propagation of signals in a package employing the Gatling gun vias is enhanced while minimizing cross talk between signal conductors and power distribution noise. Use of the Gatling gun via also permits the circuit designer to tighten the space between two circuit regions, for example.

What is claimed is:

1. An interconnection structure to connect a first conductive layer of a circuit board to a second conductive layer of the circuit board, the structure comprising:
   a center conductor via;
   a plurality of ground vias surrounding the conductor via, the ground vias each having a diameter and a position relative to the plurality of ground vias based upon a desired overall impedance of the structure; and
   a wire bond, the wire bond electrically connected to the conductor via at a first end and a conductive pattern at a second end,
   wherein the conductor via propagates electrical signals between the first conductive layer and the second conductive layer of the circuit board.

2. The interconnection structure of claim 1, wherein the conductive pattern is formed on the first conductive layer of the circuit board.

3. An interconnection structure to connect a first conductive layer of a circuit board to a second conductive layer of the circuit board, the structure comprising:
   a center conductor via;
   a plurality of ground vias surrounding the conductor via, the ground vias each having a diameter based upon a desired overall impedance of the structure; and
   a wire bond, the wire bond electrically connected to the conductor via at a first end and a conductive pattern at a second end,
   wherein the conductor via propagates electrical signals between the first conductive layer and the second conductive layer of the circuit board.

4. The interconnection structure of claim 13, wherein the conductive pattern is formed on the first conductive layer of the circuit board.

* * * * *